United States Patent [19]

Allen

[11] 4,344,071

[45] Aug. 10, 1982

[54] LIGHT SWITCHING MECHANISM

[75] Inventor: Glenn R. Allen, Thornhill, Canada

[73] Assignee: Roger A. Heller, Houston, Tex.

[21] Appl. No.: 168,234

[22] Filed: Jul. 10, 1980

[51] Int. Cl.³ .......................................... G08B 13/22
[52] U.S. Cl. .................................. 340/566; 307/117;
340/565; 340/693; 367/93
[58] Field of Search ............... 340/565, 566, 555, 600,
340/693; 367/93; 307/117

[56] References Cited

U.S. PATENT DOCUMENTS

| | | | |
|---|---|---|---|
| 3,579,220 | 5/1971 | Stevenson, Jr. | 340/566 |
| 3,582,671 | 6/1971 | Ott | 307/117 |
| 3,886,352 | 5/1975 | Lai | 340/600 |
| 4,035,798 | 7/1977 | Hackett | 367/93 |
| 4,057,791 | 11/1977 | Bimmerle et al. | 340/566 |
| 4,103,294 | 7/1978 | Stettner et al. | 340/309.1 |
| 4,106,003 | 8/1978 | Otani | 340/530 |

Primary Examiner—Glen R. Swann, III

Attorney, Agent, or Firm—Sughrue, Mion, Zinn, Macpeak & Seas

[57] ABSTRACT

An electronic sensing device, operates to actuate a household lighting fixture in response to a sensed environmental condition such as sound or movement within a room. The device is provided with a receiver for sensing the particular environmental condition, a timer responsive to the output of the receiver, switching apparatus for switching on the household lighting fixture in response to the timer, and a power-providing circuit. The timer provides that the lighting fixture will remain on for a preselected time after sensing the environmental condition, and continually resets in the continued presence of the environmental condition. The switching apparatus switches the light fixture on in response to the timer output and further provides circuitry for varying the switched-on duty cycle of the lighting fixture in order to provide a dimmer control. The power-providing circuitry applies a portion of the leading edge of each half cycle of line current to power the circuitry of the sensing device.

16 Claims, 6 Drawing Figures

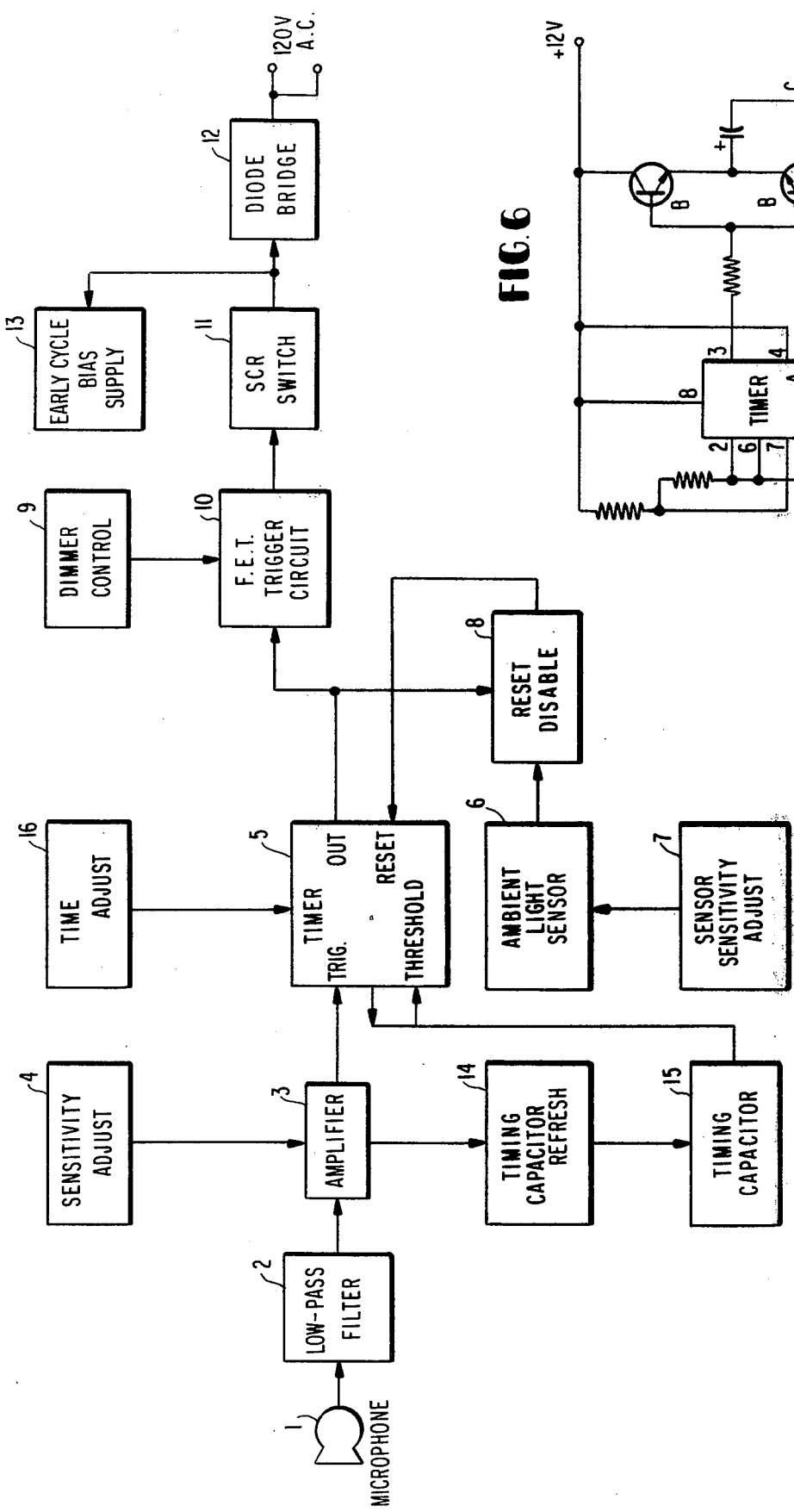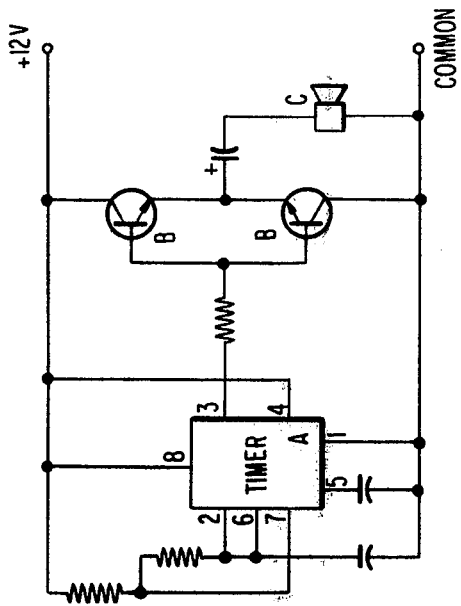

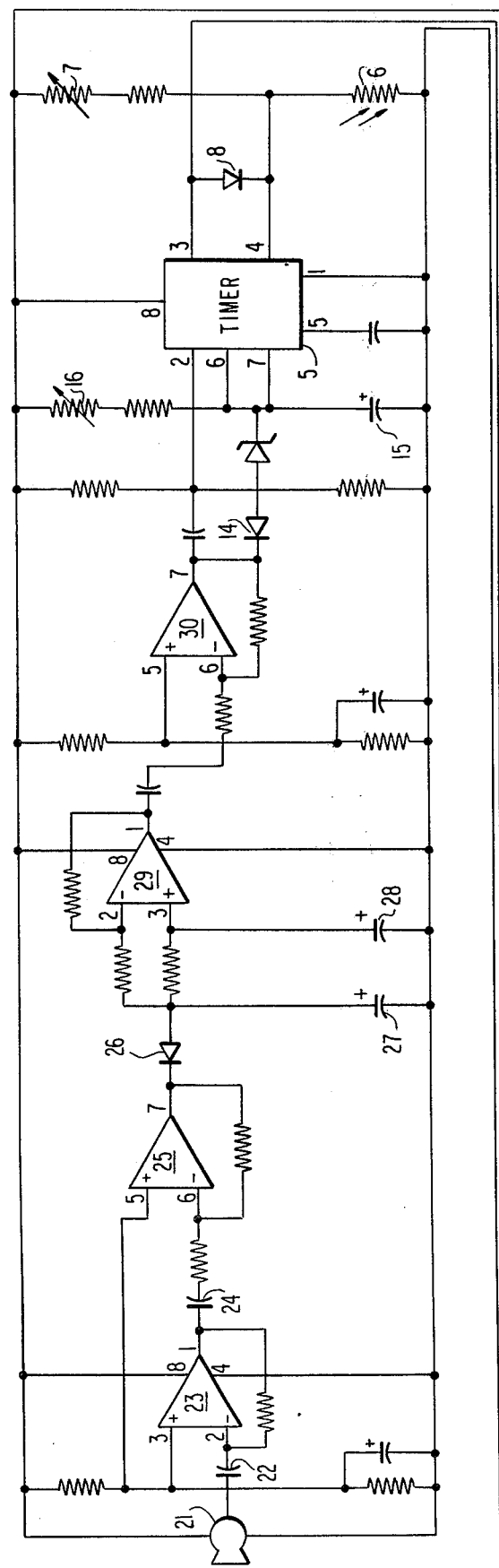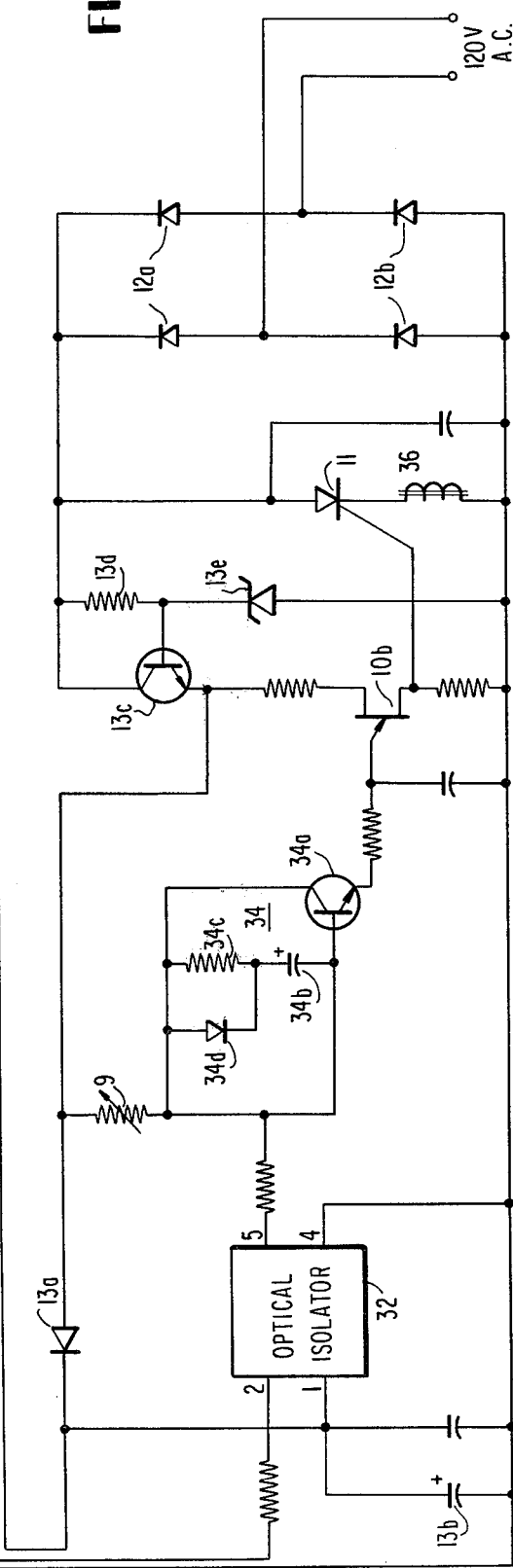
FIG.5

LIGHT SWITCHING MECHANISM

BACKGROUND OF THE INVENTION

The present invention relates to an electronic sensing device operable to actuate a household lighting fixture in response to a sensed environmental condition, such as sound or movement within a room.

It is generally known to provide switch means actuated by a sensed environmental condition such as sound or movement within a room. The U.S. Patent to Stetner, U.S. Pat. No. 4,103,294, discloses a sound actuated switch which is wired in parallel with a household light switch to act as a burglar alarm. The Stetner device employs an SCR trigger and a timer to maintain the lights on for a set period of time after the device senses a noise and triggers the alarm.

U.S. Patent to Ott, U.S. Pat. No. 3,582,671, relates to a sound responsive lighting arrangement which also employs an SCR trigger. The Ott device detects the level of sound in the room, and as the sound level decreases to a point below a pre-determined level, the device turns off the light fixture.

U.S. Patent to Otani, U.S. Pat. No. 4,106,003, discloses a burglar alarm system which utilizes an ultrasonic wave transmitting oscillator and receiver. The ultrasonic transmitter is placed in the protected room, and the receiver detects change in the ambient ultrasonic sound field. The Otani device times the duration of the changes so that changes having a duration of less than a particular time will be ignored.

U.S. Patent to Hossbach, U.S. Pat. No. 3,898,640, discloses a burglar alarm having an ultrasonic transmitter, and an ultrasonic receiving device which detects changes in the natural resonance frequency of the protected room. In this manner, the Hossbach device will ignore movements within the room itself, but will detect changes in the room dimensions due to the opening of a window or door.

While these prior art switching devices switch on either a light fixture or an alarm device in response to a sensed environmental condition, the prior art devices are powered through the use of an external power source. This causes problems and increased power consumption and further inconvenience in that the alarm device must be powered separately from the alarm or light fixture. Furthermore, the prior art devices do not disclose the concept of providing a timer circuit which is automatically reset or updated in response to continued activity within the room, therefore leading to the premature switching off of the device.

SUMMARY OF THE INVENTION

It is therefore an object of the present invention to overcome the shortcomings in the prior art switch systems. More specifically, the present invention relates to an electronic sensing device which is operable to actuate a household lighting fixture in response to a sensed environmental condition, such as sound or movement within a room. The device in accordance with the present invention is equipped with a bias supply circuit which provides a portion of the leading edge of each half cycle of line current to be diverted to power the circuitry of the electronic sensing device. In this manner, the device may share the same AC power line as the household light fixture itself, consume a minimum amount of power, and directly replace a conventional, wall mounted, light switch.

The present invention further provides timing circuitry operable to automatically turn off the lighting fixture in the absence of a sensed condition over a predetermined period of time. The timing circuitry further provides for an automatic reset or update in response to continued activity within the room in order to maintain the light fixture in an on condition for as long as the sensed condition exists.

The circuitry in accordance with the present invention further provides for a photocell or the like for determining the ambient light level so that the switch will not be actuated whenever the initial ambient light level is of a particular level. The photocell circuitry further provides reset disable circuitry so that once the timing circuitry is activated in response to a sensed condition, the ambient light level sensor will have no effect on the detection output.

The timing circuitry in accordance with a further aspect of the present invention is further provided with a pair of detection networks having long and short time constants, respectively. The short time constant detection circuit detects the presence of movement or sound within the room, while the second long time detection circuitry provides a reference level output so that permanent changes in room configuration, as well as circuitry voltage drift can be compensated for.

BRIEF DESCRIPTION OF THE DRAWINGS

FIG. 1 is a block diagram of the "passive switch" embodiment of the present invention;

FIG. 5 is a schematic illustration of the "active switch" embodiment of the present invention; and FIG. 6 is a schematic illustration of the transmitter for the "active switch" embodiment of the present invention.

DETAILED DESCRIPTION OF THE INVENTION

Figure 2:
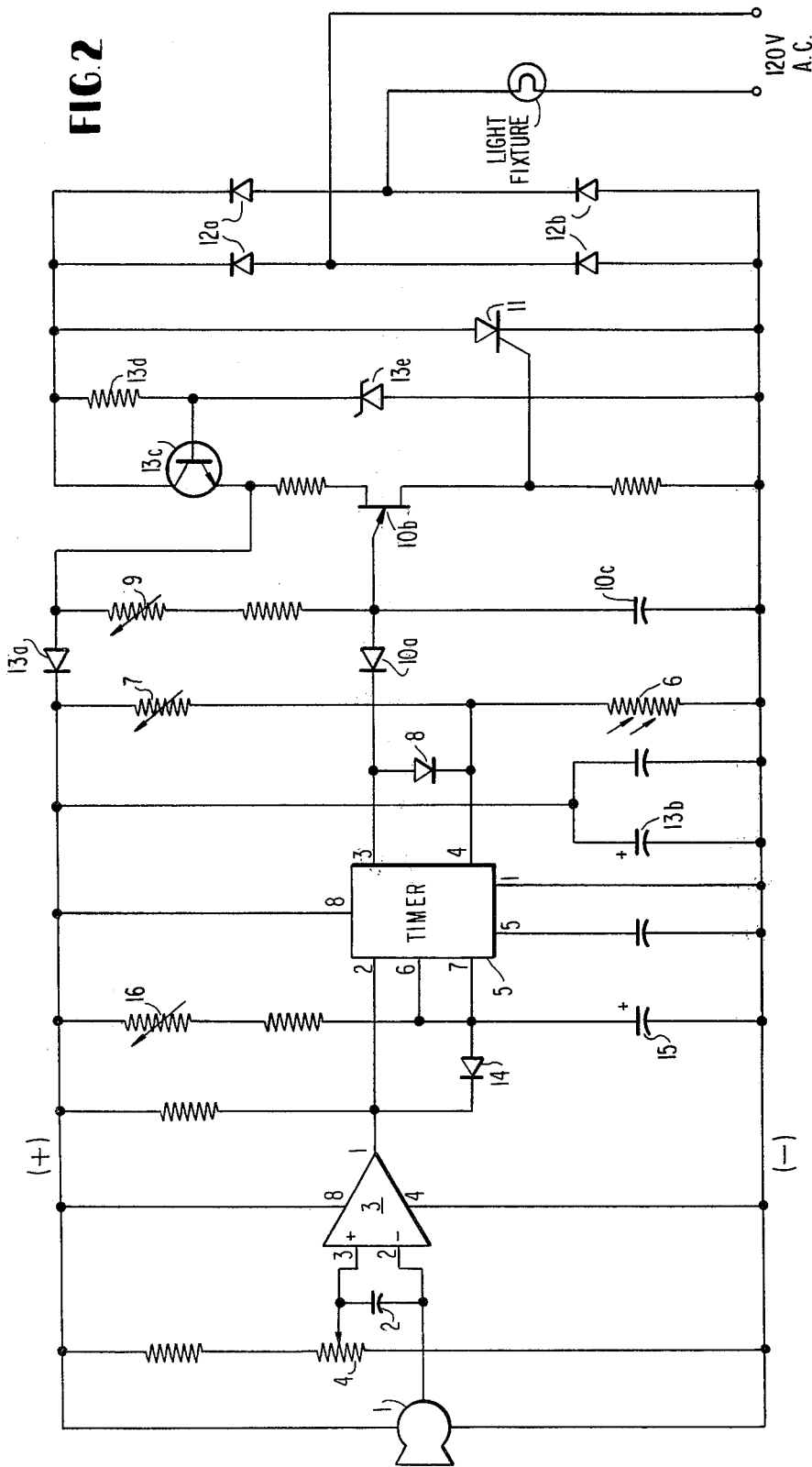
FIG. 2 is a schematic illustration of the "passive switch" embodiment of the present invention.

The "passive switch" embodiment of the present invention will first be described with reference to FIG. 1. The passive switch is actuated in response to sound energy produced by a person entering a room, for example. Sound energy is collected at microphone 1, filtered at low pass filter 2 and delivered to amplifier 3. The low pass filter 2 is provided to detect sound energy at any desired frequency level, such as infra-sonic frequencies. In response to the received sound energy, amplifier 3 provides a trigger input to timer 5 as well as a signal to timing capacitor refresh means 14. The sensitivity of the amplifier 3 is adjusted by adjustment means 4. The timer 5 additionally receives a signal from timing capacitor 15 and time adjust means 16, and provides in response thereto a trigger signal for the FET trigger circuit 10 and a signal to the reset disable means. In response to the trigger signal, the FET trigger circuit 10 applies an output to the SCR switch 11, under the further control of dimmer control circuit 9. The SCR switch 11 provides a signal to the diode bridge enabling the conduction of current through the controlled light fixture from the 120 volt AC source. SCR switch 11 also provides a signal to early cycle bias supply means.

The operation of the passive switch embodiment of the present invention shown in FIG. 1 will be described in more detail with reference to the schematic illustration of FIG. 2. Identical reference numerals are used for elements in FIG. 2 identical to elements in FIG. 1. The output from microphone 1 is applied to the inverting input of amplifier 3 which may comprise LM358 integrated circuit. The capacitor 2 coupled across pins 2 and 3 of amplifier 3 provides the low pass filter characteristic, while the potentiometer 4 provides the sensitivity adjustment. The amplifier 3 provides a low signal level at output pin 1 in response to a signal output from microphone 1, and applies this low signal level to pin 2 of timer 5 which may comprise an LM555 integrated circuit. In response to the low signal on pin 2 of timer 5, the timer provides at pin 3 a high output signal to reverse bias the diode 10a, which in turn enables a trigger pulse to be delivered to the gate of trigger FET 10b, as will be explained in more detail below.

The timer 5 operates as follows. The timer responds to the low input on pin 2 by removing the path to ground from pin 6, thus allowing timing capacitor 15 to charge to a positive voltage through time adjust potentiometer 16. The timer 5 detects the voltage on capacitor 15 at pin 7, and when this voltage rises to approximately two thirds of the supply voltage applied to pin 8 of the timer, the ground return at pin 6 is completed, capacitor 15 is discharged therethrough, and the output on pin 3 goes low indicating an off condition.

The timing capacitor refresh means is provided by diode 14 applied from pin 7 of timer 5 to the output pin 1 of amplifier 3. The diode 14 is provided to prevent a premature shut-off of the light. Specifically, the LM555 timer provides that upon an initial input signal (low voltage) from the output of amplifier 3 applied to input pin 2, the timer will provide an output signal on pin 3 and will begin charging the capacitor 15 until the voltage applied thereto reaches the two thirds voltage level, without regard to any further input signals applied to pin 2 of the timer. Thus, initially when a person walks into the room, a signal will be applied to pin 2 of the timer 5, but in spite of the continued presence of that person in the room and the continued presence of the low output applied to pin 2 of the timer, the capacitor 15 would ordinarily charge to the predetermined voltage level and momentarily turn off the light in a repetitive manner. The diode 14 however provides a discharge path to ground for capacitor 15 through pin 1 of the amplifier 3 whenever amplifier 3 provides a low signal (to ground) on pin 1 in response to sound energy. Thus, the capacitor 15 is continually "refreshed" by diode 14 in the presence of a low signal output from amplifier 3.

The present invention also provides that the light switch will not be actuated when the ambient light level is of a particular value. This is accomplished by ambient light sensor 6 having a resistance inversely proportional to the level of light impinging thereon. As the voltage level across sensor 6 is reduced, as determined by the light level and sensor sensitivity potentiometer 7, the rest input at pin 4 of timer 5 disables the output of timer from attaining a high level.

On the other hand, in the event that the light switch is already turned on, the situation should be avoided where the changing ambient light level turns off the light fixture. For example, when the light is turned on in cloudy or overcast condition, any intermittent sunlight entering the room should not be able to automatically turn off the light. Also, the light sensor should not be activated in response to the light from the light fixture itself. A reset disable diode 8 is provided so that the high output at pin 3 of the timer which causes the light fixture to be turned on is applied to reset pin 4 through diode 8, thereby disabling the reset input. When the timer is originally turned off, however, and the ambient light level is sufficiently high to provide a low input signal to reset input 4 of the timer, an input signal to pin 2 from timer will not produce the high going output at pin 3 thereof to turn on the light fixture.

The operation of the early cycle bias supply will be described in connection with the SCR switch 11 and diode bridge 12. A 60 cycle 120 volt AC signal is applied as shown between bridge diodes 12a and 12b, the light fixture connected in series therewith. It can be seen that the voltage waveform will propagate through one of bridge diodes 12a through resistor 13d and zener 13e, where a return path is provided through one of bridge diodes 12b. The voltage drop across resistor 13d causes transistor 13c to conduct, and the voltage waveform applied through one of bridge diodes 12a is coupled across the collector-emitter path of the transistor 13c, through forward biased diode 13a to thereby charge voltage supply capacitor 13b. The voltage supply capacitor 13b is of very large capacitance and provides the voltage supply of the polarities at the positive and negative nodes of the switch circuit as shown.

When the time 5 has not been triggered by a sound detection signal, a low signal to ground is provided at pin 3 of the timer to thereby forward bias diode 10a. Therefore, any current temporarily applied to the anode of diode 10a is coupled directly to ground through diode 10a and timer 5, and FET 10b is not biased on. On the other hand, assuming that timer 5 has been triggered by a sound detection signal, a positive voltage is applied to output pin 3 of the timer to thereby reverse bias diode 10a. Therefore, any current appearing at the anode of diode 10a cannot pass to ground through pin 3 of the timer and is applied to capacitor 10c to provide a voltage to the gate of FET 10b to bias the FET into conduction. A portion of the current flowing through the collector-emitter path of transistor 13c also flows through the source-drain path of FET 10b in order to provide a trigger signal to the control electrode of SCR 11. In response to the trigger signal SCR 11 conducts to provide a closed circuit from one of the bridge diodes 12a, through the SCR 11, and back through one of bridge diodes 12b, the light fixture being in series therewith.

The value of resistor 13d is chosen to be very large so that the amount of current drawn through the resistor-zener path 13d-13e when the timer does not produce an output signal is very small, on the order of 1 or 2ma and any energy applied to the light fixture is negligible.

SCR 11 becomes conductive at a portion of the AC cycle which is determined by the turn-on time of FET 10b, which in turn is determined in part by the resistance value of dimmer potentiometer 9, the higher the resistance value, the more time of the AC cycle required to bias FET 10b, on. Therefore, dimmer potentiometer 9 determines the duty cycle of the FET and SCR, and therefore, determines the brightness of the light fixture.

Thus, it can be seen that the circuit in accordance with the present invention may share the same power line as that of the light fixture. When the light fixture is not turned on, capacitor 13b is charged throughout the majority of each half cycle of current flowing through one of the bridge diodes 12a, the charging path being through transistor 13c and diode 13a. When the light is turned on, only the early portion of each half cycle of line voltage is applied to the capacitor 13b, since SCR 11 will be switched on only after transistor 13c and FET 10b begin to conduct. A charge time of as little as 1 msec per each half cycle of line voltage applied to capacitor 13b has been found to be adequate to power the circuitry of the present invention.

Figure 3:
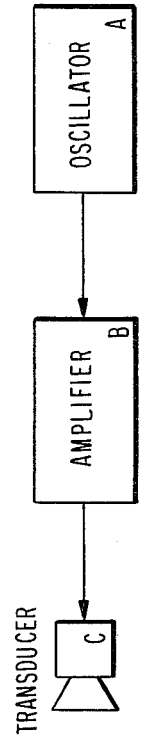
FIG. 3 is a block diagram of the transmitter for the "active switch" embodiment of the present invention.

The "active switch" embodiment of the present invention will now be described with reference to FIGS. 3 and 4. FIG. 3 illustrates a simple transmitter apparatus comprising an oscillator A, amplifier B receiving the oscillator signal, and a speaker transducer C receiving the amplified signal. The purpose of the transmitter is to fill the room of interest with a steady-state ultrasonic sound field.

Figure 4:
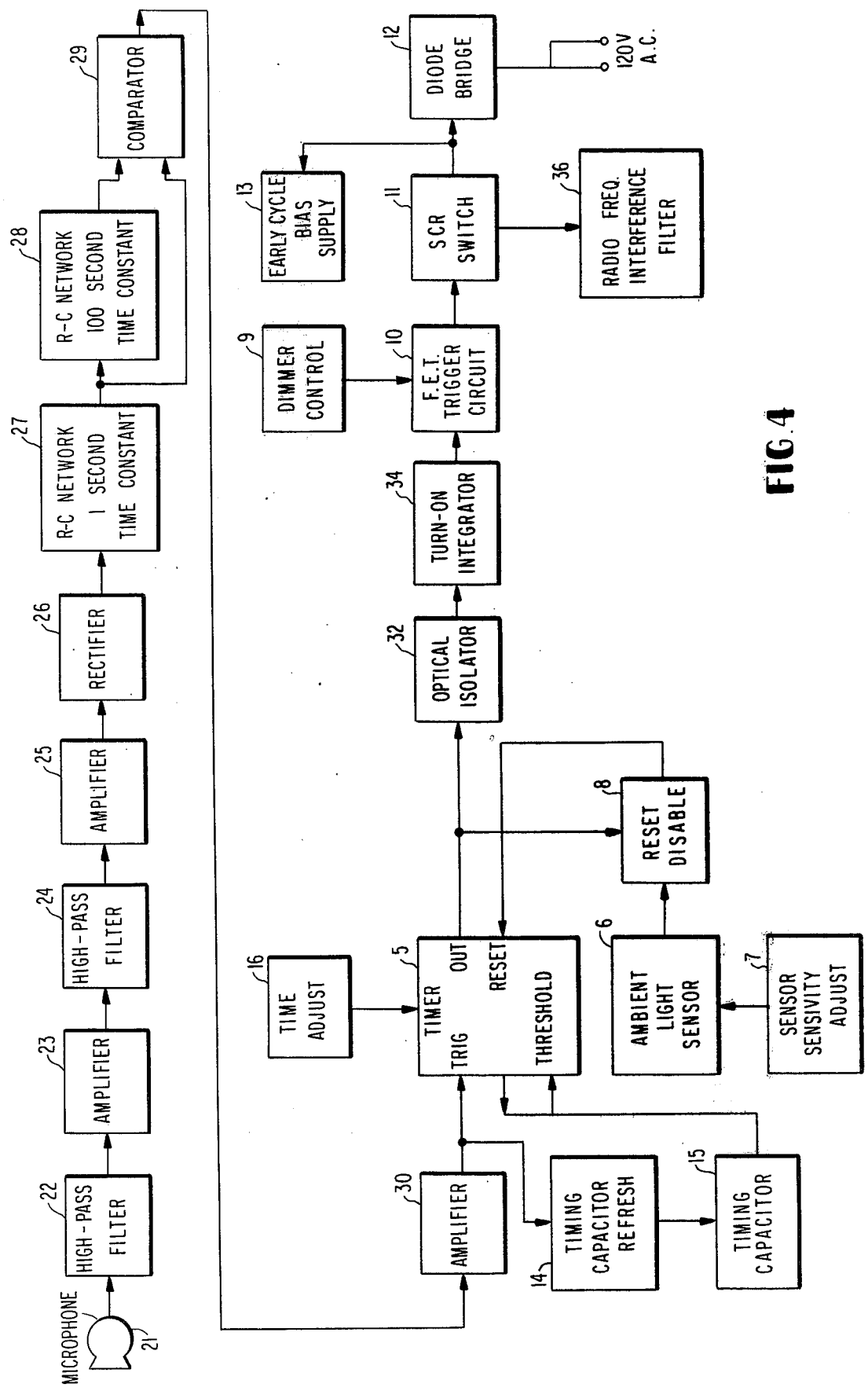
FIG. 4 is a block diagram of the "active switch" embodiment of the present invention.

With reference to FIG. 4, the active switch receiver detects the ultrasonic energy at microphone 21 and delivers the energy to a pair of high pass filters 22 and 24, and associated amplifiers 23 and 25, respectively. Changes in the overall DC level of the steady state sound field, indicative of motion or change of position in a room, is detected by rectifier 26. The DC envelope indicative of the motion is applied to a first low pass RC network 27 with a time constant of one second, the output therefrom being applied on the one hand to comparator 29 and on the other hand to a second RC low pass network 28 having a 100 second time constant, the output therefrom also being applied to comparator 29. The comparator detects the difference between the outputs from filters 27 and 28 and provides an output to amplifier 30 which in turn triggers timer 5.

The pair of filtes 27 and 28 are provided in order to detect a short-term change in the steady state ultrasonic field which may be indicative of a person entering the room of interest, while a "permanent" type change in the room acoustics, such as re-arrangement of furniture, should not set off the light switch. Thus, a steady state DC reference signal is established in the 100 second time constant filter 28 so that a "permanent" type change in a room would eventually provide a new reference DC level to the comparator. The 100 second time constant filter also compensates for thermal voltage drift in various circuit components such as amplifiers 23 and 25.

The detection signal is applied to amplifier 30, the output of which is in turn applied to trigger input of timer circuit 5. Ambient light sensor 6, sensor sensitivity adjust circuit 7, reset disable circuit 8, dimmer control 9, FET trigger circuit 10, SCR switch 11, diode bridge 12, bias supply 13, timing capacitor refresh 14, timing capacitor 15, and time adjust circuit 16, all of FIG. 4, provide functions identical to the associated circuit elements of FIGS. 1 and 2 and will therefore not be discussed in detail in connection with FIGS. 4 and 5.

The trigger output from timer 5 is applied to an optical isolator 32, the output of which is applied to FET trigger circuit 10 via turn-on integrator circuit 34. The FET trigger circuit 10 triggers the SCR switch 11 in a manner identical to that described with reference to FIGS. 1 and 2. The SCR switch circuit 11 is provided with a radio frequency interference filter 36.

The operation of the active switch receiver section of FIG. 4 will be described in more detail with reference to FIG. 5. The amplifiers 23, 25 and 39, as well as comparator 29 each may comprise one-half of an LM358 integrated circuit, the pin connections illustrated in the Figure. High pass filters 22 and 24 each comprise series coupled capacitors 22 and 24. The DC level of the high frequency acoustic field is detected at rectifying diode 26 and applied to the short and long time constant filters comprising capacitors 27 and 28, respectively, the respective outputs being applied to comparator 29. The difference signal from comparator 29 is delivered from output pin 1 to amplifier 30, which in turn provides a trigger signal to the timer 5 in a manner similar to that described with reference FIG. 2. The zener diode coupled between diode 14 and pin 7 of timer 5 provides an appropriate voltage operating point for the timer.

The timer 5 provides a trigger signal to FET 10b via optical isolator 32 and turn-on integrator 34. The optical isolator isolates amplifiers 23 and 25 from electromagnetic interference generated in the SCR switch 11. The radio frequency interference filter 36 further reduces the electromagnetic interference due to the SCR 11. The reduction in electromagnetic interference provided by isolator 32 and filter 36 is necessary in the active switch embodiment since the front-end of the active receiver section must detect a signal having a level much lower than that detected by the front-end of the passive switch receiver, and the interference caused by the switching of the SCR may, in some applications be detrimental to the detecting capabilities of the active receiver.

Optical isolator 32 may be a 4N26 integrated circuit which additionally provides a function equivalent to the diode 10a of FIG. 2.

The output from the optical isolator is applied to a turn-on integrator circuit 34 comprising transistor 34a, capacitor 34b and resistor 34c coupled in series from the base to collector of the transistor 34a, and a diode 34d coupled across resistor 34c. The trigger current is applied to the base of transistor 34a via the dimmer potentiometer 9. Again, the dimmer control 9 controls the point of the voltage waveform at which the FET 10b is biased on as in the FIG. 2 embodiment. However, the voltage applied to the gate of FET 10b as determined by dimmer control 9 is further determined by the low pass filter arrangement of the integrator 34. Therefore, the duty cycle of SCR 11 starts out at a very low value and rises gradually in accordance with the low pass characteristics of RC circuit 34c and 34b, until the SCR is on for the predetermined duty cycle as determined by control 9. This causes the light fixture to brighten in a gradual fashion over the course of a second or two when a person walks into the room.

FIG. 6 illustrates the transmitter for the active switch. The transmitter comprises another LM555 timer A arranged with a voltage feed-back path so as to provide an oscillating signal to emitter-coupled transistors B, the outputs of which are applied to ultrasonic transducer C.

Various changes or additions of elements may be made within the scope and spirit of this invention. It is to be understood that the invention is not limited to specific details, examples and the preferred embodiments shown and described herein.

I claim:

1. A switch apparatus for automatically turning an electrical device on and off in response to a sensed condition comprising:

receiver means for sensing a particular condition and for providing a first signal in response to said particular condition;

timer means responsive to said first signal for providing a second signal having a duration lasting a predetermined time following initiation of said first signal;

main switch means receiving said second signal for turning said electrical device on and off in response to said second signal; and power-providing circuitry connected on one hand to an A.C. power supply and on the other hand to said main switch means for providing operating power to said receiver means, said timer means, said main switch means, and said electrical device; said power-providing circuitry comprising:

bridge means for rectifying the voltage from said A.C. power supply to provide a rectified voltage;

capacitive means for storing a charge from said rectified voltage; and first switch means for applying a portion of said rectified voltage to said capacitive means, whereby said receiver means and said timer means are powered by said capacitive means.

2. The apparatus of claim 1 further comprising a transmitter for providing an energy field within a predefined area, and said receiver means comprises a first detector for detecting a steady state level of said energy field, and a second detector for detecting a change in said steady state level to provide said first signal in response thereto.

3. The apparatus of claim 2 wherein said first detector is a filter having a first time constant, and said second detector is a filter having a second time constant longer than said first time constant.

4. The apparatus of claim 1 wherein said timer means comprises bistable means responsive to the occurrence of said first signal for switching from a first state to a second state, time determining means responsive to said bistable means switching to said second state for causing said bistable means to switch back to said first state after a predetermined period of time, and refresh means responsive to said first signal for preventing operation of said time determining means as long as said first signal is present.

5. The apparatus of claim 4 further comprising ambient sensor means for sensing an ambient condition and for disabling said bistable means from switching from said first state to said second state when said ambient condition exists despite the presence of said particular condition.

6. The apparatus of claim 5 further comprising means for overriding said ambient sensor means when said bistable means is already in said second state when said ambient condition is sensed.

7. A switch apparatus for automatically turning an electrical device on and off in response to a sensed condition comprising:

receiver means for sensing a particular condition and for providing a first signal in response to said particular condition;

timer means responsive to said first signal for providing a second signal having a duration lasting a predetermined time following initiation of said first signal, said timer means comprising bistable means responsive to the occurrence of said first signal for switching from a first state to a second state, time determining means responsive to said bistable means switching to said second state causing said bistable means to switch back to said first state after a predetermined period of time, and refresh means responsive to said first signal for preventing operation of said time determining means as long as said first signal is present;

resetting means for continually resetting said timer means to said second state in the continued presence of said particular condition;

main switch means receiving said second signal for turning said electrical device on and off in response to said second signal; and power-providing circuitry connected on one hand to an A.C. power supply and on the other hand to said switch means for providing operating power to said receiver means, said timer means, said switch means, and said electrical device.

8. The apparatus of claim 7 wherein said power providing circuitry comprises:

bridge means for rectifying the voltage from said A.C. power supply to provide a rectified voltage;

capactive means for storing a change from said rectified voltage; and first switch means for applying a portion of said rectified voltage to said capacitive means, whereby said receiver means and said timer means are powered by said capacitive means.

9. The apparatus of claim 1 or 8 wherein said first switch means is turned on to apply a portion of said rectified voltage to said capacitive means (i) during the leading edge of each half cycle of said voltage from said A.C. power supply when said electrical device is turned on, and (ii) during the majority of each half cycle of said voltage from said A.C. power supply when said electrical device is turned off.

10. The apparatus of claim 9 wherein said bridge means is a full wave rectifier in series with said electrical device.

11. The apparatus of claim 1 or 8 wherein said main switch means comprises:

second switch means coupled in series with said bridge means and said electrical device;

third switch means providing an output to said second switch means in response to an output of said first switch means, said second switch means being turned on in response to said output from said third switch means.

12. The apparatus of claim 11 wherein said first switch means is turned off in response to said second switch being turned on.

13. The apparatus of claim 11 wherein said second switch is an SCR and said third switch is an FET.

14. The apparatus of claim 11 further providing dimmer means to vary the time for said third switch to respond to said output of said first switch, whereby the duty cycle of said second switch is variable in accordance with said dimmer means.

15. The apparatus of claim 14 wherein said output of said first switch is coupled to said third switch by way of said dimmer means and a low pass filter means, whereby said duty cycle of said second switch rises in accordance with the low pass filter rise time.

16. The apparatus of claim 7 wherein said receiver means comprises a microphone for detecting acoustical energy, and an amplifier for providing said first signal in response to said acoustical energy.

* * * * *